United States Patent
Ivanov et al.

(10) Patent No.: US 8,039,394 B2
(45) Date of Patent: Oct. 18, 2011

(54) METHODS OF FORMING LAYERS OF ALPHA-TANTALUM

(75) Inventors: Ivan Petrov Ivanov, Apple Valley, MN (US); Wei Tian, Bloomington, MN (US); Mallika Kamarajugadda, Eden Prairie, MN (US); Paul E. Anderson, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 76 days.

(21) Appl. No.: 12/492,206

(22) Filed: Jun. 26, 2009

(65) Prior Publication Data

US 2010/0330800 A1 Dec. 30, 2010

(51) Int. Cl.
 *H01L 21/44* (2006.01)
(52) U.S. Cl. . 438/683; 438/685; 438/687; 257/E21.171; 257/E21.168; 257/E21.169
(58) Field of Classification Search ............... 438/683, 438/685, 687; 257/E21.171, E21.168, E21.169
See application file for complete search history.

(56) References Cited

U.S. PATENT DOCUMENTS

| | | | |
|---|---|---|---|
| 7,081,306 B2 | 7/2006 | Fartash | |
| 7,253,109 B2* | 8/2007 | Ding et al. | 438/685 |
| 2002/0142589 A1* | 10/2002 | Sundarrajan et al. | 438/683 |
| 2005/0009325 A1* | 1/2005 | Chung et al. | 438/637 |
| 2005/0170105 A1 | 8/2005 | Fartash | |
| 2006/0148253 A1* | 7/2006 | Chung et al. | 438/681 |
| 2007/0280848 A1 | 12/2007 | Narayan et al. | |

OTHER PUBLICATIONS

R. Hoogeveen, M. Moske, H. Geisler, and K. Samwer, Thin Solid Films, 275 (1996) 203.
L. A. Clevenger, A. Mutscheller, J. M. E. Harper, C. Cabral, Jr., K. Barmak, J. Appl. Phys. 72 (1992) 4918.
D. W. Face, D. E. Prober, J. Vac. Sci. Technol. A5 (1987) 3408.
J. Alami, P. Eklund, J.M. Andersson, M. Lattemann, E. Wallin, J. Bohlmark, P. Persson, and U. Helmersson, Thin Solid Films, 515 (2007) 3434-3438.
P. Catania, J. P. Doyle, J. J. Cuomo, J. Vac. Sci. Technol. A 10 (1992) 3318.
K. Ino, T. Shinohara, T. Ushiki, T. Ohmi, J. Vac. Sci. Technol. A 15 (1997) 2627.
L.G. Feinstein, Factors Controlling the Structure of Sputtered Ta Films, Thin Solids Films, 1973) 129-145.

* cited by examiner

*Primary Examiner* — Hsien Ming Lee
(74) *Attorney, Agent, or Firm* — Campbell Nelson Whipps LLC

(57) ABSTRACT

A method of forming a layer of alpha-tantalum on a substrate including the steps of depositing a layer of titanium nitride on a substrate; and depositing a layer of alpha-tantalum on the layer of titanium nitride, wherein the deposition of the alpha-tantalum is carried out at temperatures below about 300° C.

23 Claims, 5 Drawing Sheets

METHODS OF FORMING LAYERS OF
ALPHA-TANTALUM

BACKGROUND

Tantalum (Ta) is a refractory metal having a high melting point, a low electrical resistivity, and which is generally inert at temperatures below about 150° C. Alpha-tantalum (α-Ta) is the bulk equilibrium or stable-phase of tantalum. α-Ta has numerous applications in magnetic thin films devices including magnetic disk hard drives, and as diffusion barriers in integrated circuits fabrication where copper interconnect technology is used. Because of its numerous uses, there remains a need for methods of forming α-Ta.

BRIEF SUMMARY

A method of forming a layer of alpha-tantalum on a substrate including the steps of depositing a layer of titanium nitride on a substrate; and depositing a layer of alpha-tantalum on the layer of titanium nitride, wherein the deposition of the alpha-tantalum is carried out at temperatures below about 300° C.

A method of forming an article including the steps of: providing a substrate, the substrate having an aluminum interconnect structure formed thereon or therein; placing the substrate in a first chamber; depositing a layer of titanium nitride on the substrate in the first chamber; breaking the vacuum in the first chamber; placing the substrate having the titanium nitride layer formed thereon in a second chamber; depositing a layer of alpha-tantalum on the layer of titanium nitride; and depositing a layer of copper on the alpha-tantalum layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
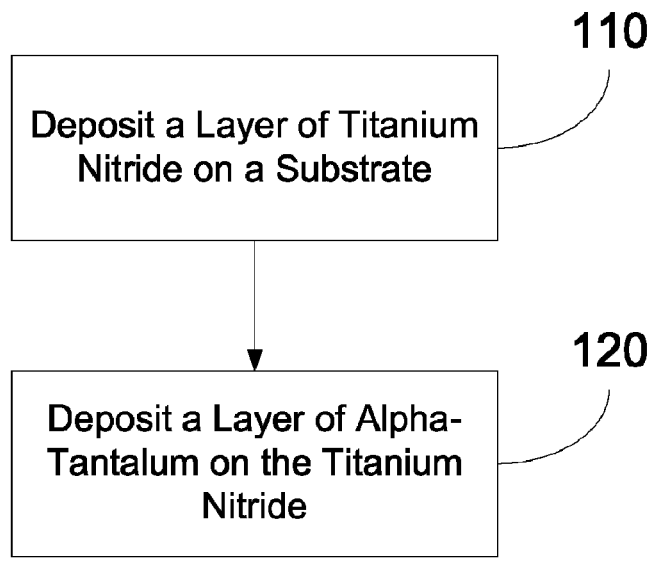
FIG. 1 is a flowchart depicting an exemplary method as disclosed herein.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

As used herein, forming a layer on another layer or a structure does not necessarily imply that the formed layer completely covers the underlying layer or structure. The formed layer may only partially cover the underlying layer or structure to be formed thereon.

Disclosed herein are methods of forming alpha-tantalum (α-Ta). The methods disclosed herein offer the advantage of forming a layer of α-Ta on a layer of titanium nitride (TiN) at low temperatures. Formation of α-Ta on a layer of TiN can offer advantages because TiN is a material with advantageous properties, including thermal stability, low resistivity and excellent barrier properties. Low temperature formation of the α-Ta can offer advantages of a process that is not as expensive and is generally easier than high temperature deposition methods.

Methods disclosed herein also offer the characteristic of being able to break the vacuum between the deposition of the TiN and deposition of the α-Ta. This characteristic can be greatly advantageous because it allows simple and inexpensive separation of two fabrication processes into two different locations. For example, in order to fabricate an article that includes both aluminum (Al) and copper (Cu) interconnects, it is generally necessary to carry out the fabrication steps in two different facilities due to the need to avoid cross contamination. Therefore, if the TiN layer can be deposited on an article that includes aluminum in an aluminum deposition facility, the article can then be taken to another facility, with a barrier layer (TiN) in place and the α-Ta can be deposited in a second facility, where the remaining portion of the article (including Cu) can be fabricated.

An exemplary method as disclosed herein is depicted in the flow diagram in FIG. 1. The exemplary method depicted there includes, step 110, depositing a layer of TiN on a substrate and step 120, depositing a layer of α-Ta on the layer of TiN.

Generally, any substrates can be utilized in methods disclosed herein. Exemplary substrates include, but are not limited to semiconductor materials. Exemplary semiconductor materials include silicon; materials including silicon; such as a mixture of silicon and germanium; and other similar materials such as oxides or nitrides of silicon or silicon and germanium. The substrate may or may not include other previously formed layers or structures formed thereon or therein.

Deposition of the layer of titanium nitride (TiN) can be accomplished using both ionizing or non-ionizing deposition methods. The deposition can be accomplished using various techniques, including, but not limited to physical vapor deposition (PVD), chemical vapor deposition (CVD), molecular beam epitaxy (MBE), atomic layer deposition (ALD), and combinations thereof. In embodiments, PVD, CVD, or a combination thereof can be utilized to deposit the TiN layer. Exemplary specific PVD methods include, but are not limited to, evaporative deposition, electron beam PVD, sputter deposition, and pulsed laser deposition. CVD methods include those characterized by the operating pressure, atmospheric pressure CVD (APCVD), low-pressure CVD (LPCVD), and ultra high vacuum (UHVCVD); those characterized by the physical characteristics of the vapor, aerosol assisted CVD (AACVD), and direct liquid injection CVD (DLICVD); plasma methods, microwave plasma-assisted CVD (MPCVD), plasma enhanced CVD (PECVD), remote plasma enhanced CVD (RPECVD); atomic layer CVD (ALCVD); hot wire CVD (HWCVD); metalorganic chemical vapor deposition (MOCVD); hybrid physical-chemical vapor deposition (HPCVD); rapid thermal CVD (RTCVD); and vapor phase epitaxy (VPE). In embodiments, PVD techniques including, but not limited to sputtering, laser ablation, e-beam and thermal evaporation techniques, or combinations thereof can be utilized. In embodiments, a sputter deposition technique referred to as self ionized plasma (SIP) sputtering can be utilized to deposit the TiN.

Commercially available systems for deposition of thin films can be utilized herein. A specific exemplary system that can be utilized includes ENDURA™ 5500 PVD System, available from Applied Materials, Inc. (Santa Clara, Calif.).

Generally, the layer of TiN can have any useful thickness. In embodiments, the TiN layer can have a thickness from about a monolayer of TiN to about 2000 Angstroms (Å) thick or more. In embodiments, the TiN layer can have a thickness from about a couple of monolayers to about 2000 Å. In embodiments, the TiN layer can have a thickness from about 100 Å to about 1000 Å. Parameters of the particular deposition method can be used at least in part to control the thickness of the TiN layer. Exemplary parameters that can be utilized to control the thickness of the TiN layer include, but are not limited to, the temperature of deposition, the pressure of deposition, the time of deposition, the power of the deposition, the degree of ionization of Ti atoms at the coated substrate (ranging from 0 to 100% ionized), or combinations thereof.

Specific temperatures that can be utilized to form the layer of TiN can depend at least in part on the specific deposition method being utilized. Generally, the layer of TiN can be deposited at a temperature of less than about 500° C. In embodiments, the layer of TiN can be deposited at a temperature of less than about 300° C. In embodiments, the TiN can be deposited at a temperature from about room temperature (e.g. from about 20° C. to about 25° C.) to about 300° C. In embodiments, the TiN can be deposited at a temperature of about 200° C.

Specific pressures that can be utilized to form the layer of TiN can depend at least in part on the specific deposition method being utilized. Generally, the layer of TiN can be deposited at a low pressure, i.e., under a vacuum. In embodiments, TiN can be deposited at pressures below about 500 Pa. The specific deposition method used can dictate, at least in part, the pressure that is utilized.

Depositing the layer of TiN may include application of a substrate voltage bias. The voltage bias can depend, at least in part on the particular method being utilized for deposition, and in embodiments can range from about 0 Volts to about −500 volts, when using conventional processes.

Generally, the time of deposition will depend at least in part on the desired thickness of TiN to be deposited, the method being used to deposit the TiN, and other factors. In embodiments, the TiN can be deposited for from about a couple of seconds to a couple of minutes. In embodiments, the TiN can be deposited for from about 5 seconds to about 2 minutes. In embodiments, the TiN can be deposited for from about 5 seconds to about 1 minute. In embodiments, about 1 minute.

Lattice matching may occur between the TiN and a layer or layers above and/or below it. Lattice matching refers to lattice points of crystal planes of materials forming a common interface that approximately match each other geometrically across their interface. For two distinct crystal planes to match geometrically across their interface, the symmetries of these planes are substantially identical and their lattice mismatches are generally within less than about 5% of each other. If the TiN layer is crystalline and therefore has a particular crystal plane, it can lattice match with other adjacent layers to either control the layer of TiN, the adjacent layer, or both. Lattice matching can thereby offer advantages in controlling the crystal structure.

The TiN that is deposited can be crystalline, amorphous, or a combination thereof. In an embodiments, amorphous TiN can be deposited, and utilized as a seed layer for α-Ta. The TiN that is deposited, if crystalline or partially crystalline, can have surfaces with various crystal planes. Exemplary crystal planes of the bcc (body centered cubic) TiN surface can include, but are not limited to, TiN (111), and TiN (200). In embodiments, the TiN layer can have a (111) plane, a (200) plane, or an amorphous structure.

The next step in the exemplary method can be step 120, depositing a layer of α-Ta on the layer of TiN.

Deposition of the layer of α-Ta can be accomplished using known methods, including, but not limited to PVD, CVD, MBE, ALD, and combinations thereof. In embodiments, PVD, CVD, or a combination thereof can be utilized to deposit the α-Ta layer. Exemplary specific PVD methods include, but are not limited to those discussed above. In embodiments, a sputter deposition technique referred to as self ionized plasma (SIP) sputtering can be utilized to deposit the α-Ta.

Generally, the layer of α-Ta can have any useful thickness. In embodiments, the α-Ta layer can have a thickness from about a monolayer of α-Ta to micrometers (μm) thick. In embodiments, the α-Ta layer can have thicknesses from a few Å to about 5 μm. In embodiments, the α-Ta layer can have thicknesses from about 2 Å to about 2000 Å thick or more. In embodiments, the α-Ta layer can have a thickness from about a couple of monolayers to about 200 Å. In embodiments, the α-Ta layer can have a thickness from about 50 Å to about 500 Å. Parameters of the particular deposition method can be used at least in part to control the thickness of the α-Ta layer. Exemplary parameters that can be utilized to control the thickness of the α-Ta layer include, but are not limited to, the temperature of deposition, the pressure of deposition, the time of deposition, the power of the deposition, the degree of ionization of Ta atoms at the coated substrate (ranging from 0 to 100% ionized), or combinations thereof.

Specific temperatures that can be utilized to form the layer of α-Ta can depend at least in part on the specific deposition method being utilized. Generally, the layer of α-Ta can be deposited at a temperature of less than about 300° C. In embodiments, the layer of α-Ta can be deposited at a temperature of less than about 300° C. In embodiments, the α-Ta can be deposited at a temperature from about room temperature (e.g. from about 20° C. to about 25° C.) to about 300° C. In embodiments, the α-Ta can be deposited at room temperature.

Specific pressures that can be utilized to form the layer of α-Ta can depend at least in part on the specific deposition method being utilized. Generally, the layer of α-Ta can be deposited at a low pressure, i.e., under a vacuum. In embodiments, α-Ta can be deposited at pressures below about 500 Pa. The specific deposition method used can dictate, at least in part, the pressure that is utilized.

Generally, the time of deposition will depend at least in part on the desired thickness of α-Ta to be deposited, the method being used to deposit the α-Ta, and other factors. In embodiments, the α-Ta can be deposited for from about a couple of seconds to about a minute. In embodiments, the α-Ta can be deposited for from about 5 seconds to about 30 seconds. In embodiments, the α-Ta can be deposited for from about 5 seconds to about 1 minute. In embodiments, about 20 seconds.

The Ta that is deposited can be crystalline, amorphous, or a combination thereof. Generally, α-Ta, which can also be referred to as bcc Ta has a body centered cubic crystal structure. α-Ta that can be deposited herein can be crystalline, amorphous, or a combination thereof. The α-Ta that is deposited, if crystalline or partially crystalline, can have surfaces with various crystal planes. Exemplary crystal planes of α-Ta can include, but are not limited to, α-Ta (110), and α-Ta (200), or combinations thereof (combinations of these crystal planes and others not enumerated herein can also be utilized). In embodiments, the α-Ta layer can have a (110) structure, or an amorphous structure. The α-Ta that is deposited may have lattice matching with layers above or below it, or both. In embodiments of the methods disclosed herein, the crystal planes of the α-Ta can be controlled and in embodiments the crystal planes of the α-Ta can be formed without exerting control over the crystal plane that is formed.

In embodiments where the crystal planes of the α-Ta is to be controlled, generally it can be accomplished by controlling the crystal planes of the material below it, in embodiments the crystal planes of the TiN below it. In such embodiments, the α-Ta layer can be lattice matched with the TiN layer. This can generally be accomplished by assigning a specific crystallographic orientation to the TiN before depositing the α-Ta. One method of assigning a specific crystallographic orientation to the TiN is to deposit a controlling layer on which the TiN is deposited.

In embodiments, the step of depositing the TiN and the step of depositing the α-Ta can be performed in-situ. In this context, "in-situ" means that the vacuum of the chamber that houses the substrate during deposition of the TiN is maintained while the α-Ta is deposited, i.e., the vacuum is not broken. In embodiments, the vacuum can be broken between the steps of depositing the TiN and the α-Ta.

The ability to break the vacuum between deposition of the TiN and the α-Ta can offer advantages. For example, it can allow TiN to be deposited on a substrate at a different location (or time, or both) than α-Ta is deposited without needing to clean the oxidized (likely lightly oxidized) TiN surface. This can be advantageous because it can allow simple and inexpensive separation of two fabrication processes into two different locations. For example, in order to fabricate an article that includes both aluminum (Al) and copper (Cu), it is generally necessary to carry out the fabrication steps in two different facilities due to the need to avoid cross contamination. Therefore, if the TiN layer can be deposited on an article that includes aluminum in an aluminum deposition facility, the article can then be taken to another facility, with a barrier layer (TiN) in place and the α-Ta can be deposited in a second facility, where the remaining portion of the article (including Cu) can be fabricated.

A substrate upon which TiN has been deposited can be stored for extended periods of time before α-Ta is deposited. Such an interim storage period does not require that the previously deposited TiN surface be processed again or modified in any way before deposition of the α-Ta, which can also offer advantages for processing simplicity.

Figure 2:
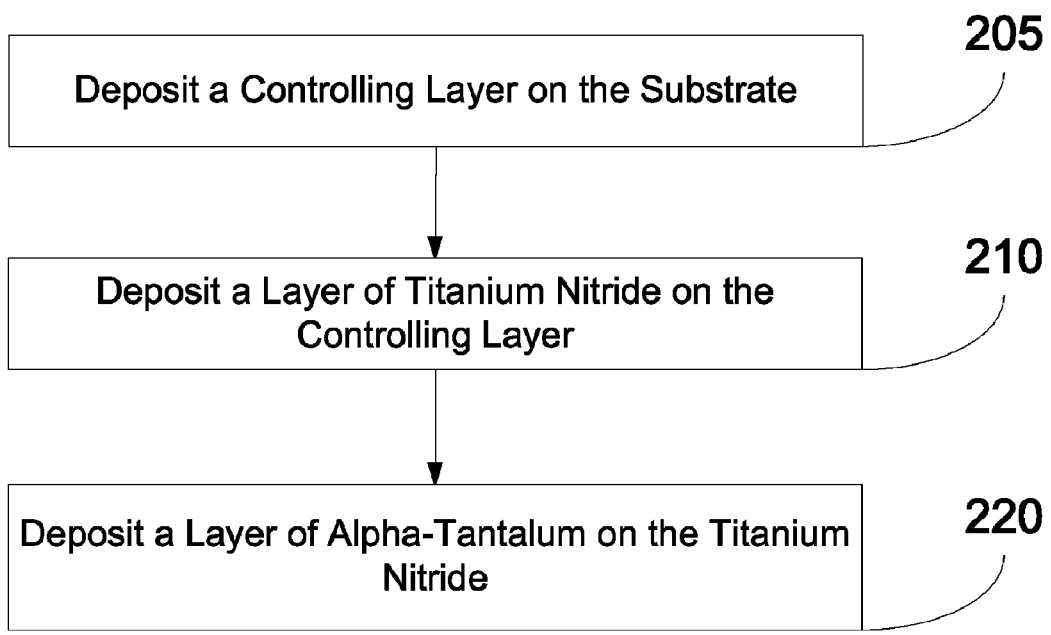
FIG. 2 is a flowchart depicting an exemplary method including depositing a controlling layer as disclosed herein.

FIG. 2 depicts an exemplary method for depositing a crystallographically controlled layer of α-Ta. The first step in this exemplary method is step 205, depositing a controlling layer on a substrate. The purpose of the controlling layer is to control the crystallographic structure of the TiN which ultimately controls the crystallographic structure of the α-Ta.

The controlling layer can generally be any material that can be deposited with a known crystallographic structure. Exemplary materials that can be utilized as the controlling layer include, but are not limited to, tungsten (W). Tungsten can generally be deposited on an underlayer in order to control its crystal planes. One exemplary method of controlling the crystal planes of tungsten is to deposit in on an underlayer of Ti. Other methods and materials for underlayers can also be utilized. Deposition methods that can controllably deposit a known crystallographic form of the material can be utilized herein; such methods include, but are not limited to those discussed above.

After deposition of the controlling layer, the next step, step 210 is deposition of the TiN layer (as discussed above), followed by step 220, deposition of the α-Ta layer on the TiN layer. The controlling layer will dictate the crystallographic structure of the deposited TiN and the TiN will dictate the crystallographic structure of the deposited α-Ta layer.

A specific exemplary embodiment of a method according to FIG. 2 includes the following. Deposition of a W (110) layer as a controlling layer, followed by deposition of TiN, which will have a strong (111) orientation (because of the W(110)), and then finally deposition of α-Ta which will have a (110) structure (because of the TiN (111)).

Methods disclosed herein can also include other optional steps. The method depicted in FIG. 3 includes optional steps that can be carried out in various embodiments of methods herein. The first optional step can include step 304, depositing a first optional layer or structure on a substrate. An exemplary optional layer can include a controlling layer (such as that discussed above). The second optional step can include step 325, depositing a second optional layer or structure on the layer of α-Ta. An exemplary optional structure can include structures that include copper (Cu) interconnect technology, aluminum (Al) interconnect technology, or both. The optional layers or structures (first, second, or both) can be formed on or within the substrate or on the layer of α-Ta respectively. The specific materials and/or structures to be formed can depend at least in part on the desired article or structure to be made. Optional layers can generally be fabricated using methods including those discussed above.

Methods disclosed herein can be utilized to connect copper interconnect technology and aluminum interconnect technology structures on a single substrate. In an embodiment, such a method can be utilized to connect aluminum interconnect technology that is formed on or in a substrate to copper interconnect technology that will be formed after the α-Ta containing structure is formed. Use of the α-Ta on a layer of TiN offers a "connection technology" for the aluminum interconnect technology and the copper interconnect technology. The α-Ta offers an advantage over β-Ta because of its lower resistivity (25 μOhmcm versus 200 μOhmcm) and its higher thermal stability (as compared to β-Ta which, due to its high defectivity, will attempt to structurally reconstruct itself over time, which can lead to reliability problems). The methods presented herein offer an easy, cost effective method for forming the α-Ta.

Figure 4:
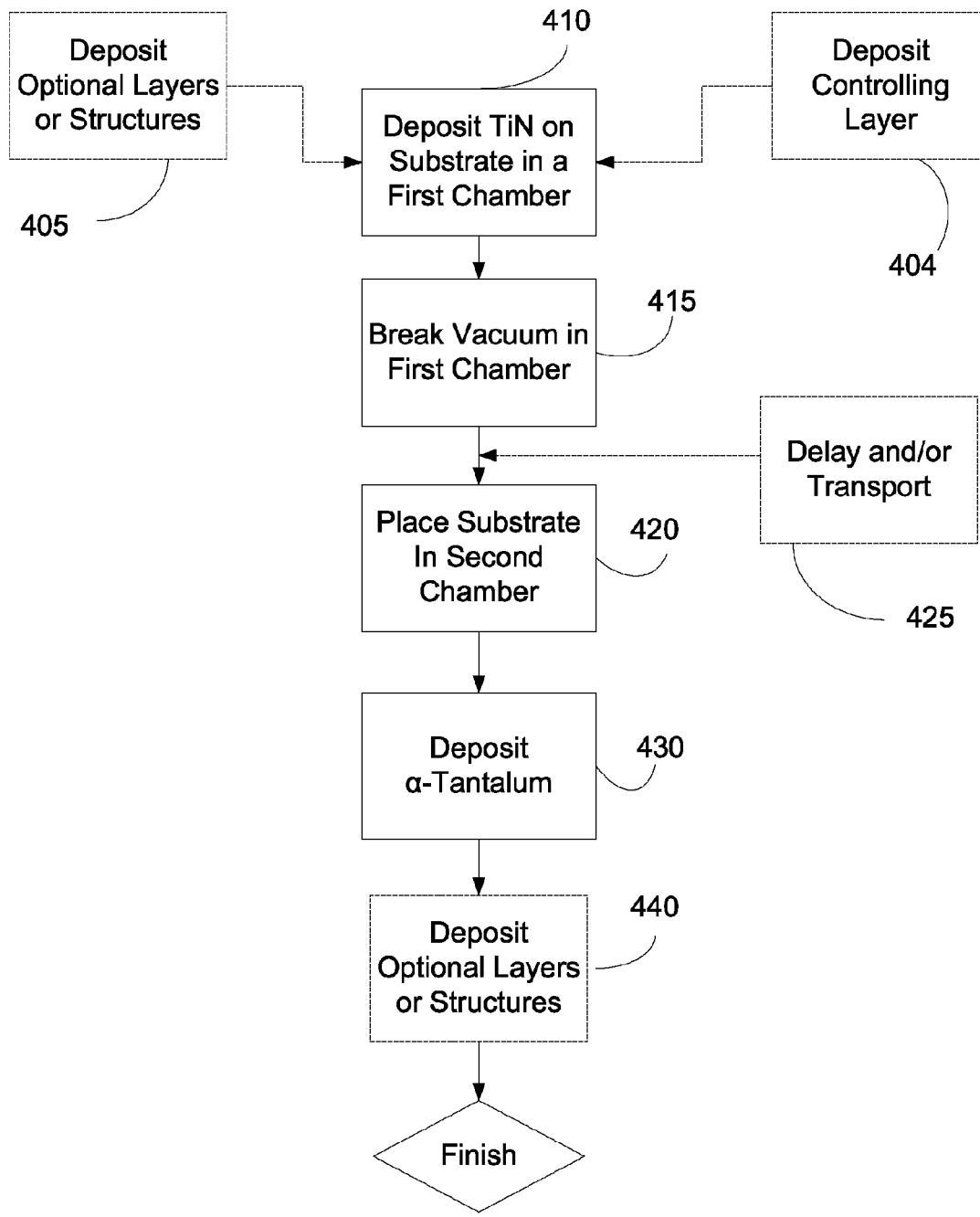
FIG. 4 is a flowchart depicting an exemplary method of forming an article including both copper and aluminum structures as disclosed herein.

One such exemplary method is depicted in FIG. 4 and begins with step 410, depositing TiN on a substrate. The substrate and deposition of the TiN can be as discussed above. The substrate can include aluminum interconnect structures or structures that were fabricated using aluminum fabrication methods. In this exemplary method, the TiN is deposited in a first chamber. More specifically, the TiN can be deposited in a first chamber that is associated with a first deposition system. In embodiments of methods disclosed herein, the first chamber or first deposition system can be located in a first location.

The method depicted in FIG. 4 can also include the optional steps 405 and 404, depositing optional layers or structures and depositing a controlling layer, respectively. The step of depositing a controlling layer can be undertaken as discussed above. Step 405, depositing optional layers or structures can be carried out as known and can be accomplished in order to form various desired articles. The optional structures or layers can be structures or layers that can be, but need not be fabricated using aluminum interconnect processing methods.

The next step in the method depicted in FIG. 4 includes step 415, breaking the vacuum chamber. The purpose of this step is generally to remove the article from the first chamber or the first deposition system. Generally, the step of breaking the vacuum can be accomplished as would be known to an individual utilizing the specific deposition system, and can include bringing the pressure within the chamber to or close to atmospheric pressure. Once the vacuum in the chamber has been broken, the method can no longer be considered an in situ method. Once the vacuum has been broken, the substrate, having TiN deposited thereon can be removed from the vacuum chamber.

The method depicted in FIG. 4 includes optional step 425, of delaying and/or transporting. In embodiments, transporting the TiN coated substrate can be undertaken in order to carry out the remaining portions of the method in a different facility. This can be advantageous because it can allow separation of the two portions of the process into two different locations. For example, in order to fabricate an article using aluminum interconnect technology and then add copper interconnects, it is generally necessary to carry out the fabrication steps in two different facilities due to the need to avoid cross contamination. Therefore, if the TiN layer can be deposited on an article that includes aluminum interconnects in an aluminum deposition facility, the article can then be transported to another facility, with a barrier layer (TiN) in place and the α-Ta can be deposited in a second facility, where the remaining portion of the article (including Cu interconnects for example) can be fabricated.

In embodiments, optionally delaying the next step in the method can also be advantageous because it can simplify processing and scheduling thereof. A substrate upon which TiN has been deposited can be stored for extended periods of time before α-Ta is deposited. Such an interim storage period does not require that the previously deposited TiN surface be processed again or modified in any way before deposition of the α-Ta, which can also offer advantages for processing simplicity.

The method depicted in FIG. 4 includes a next step, step 420, of placing the substrate (including the TiN layer) in a second chamber. The second chamber can be associated with a second deposition system. In embodiments of methods disclosed herein, the second chamber or second deposition system can be located in a second location. The second location, in embodiments where the first location was an aluminum processing location can be a copper processing location. Once the substrate is placed in the second chamber (step 420), the pressure within the chamber can be decreased (not shown in FIG. 4) and the next step can be carried out, step 430, depositing the α-Ta. An advantage provided by methods disclosed herein is that the TiN surface does not have to be processed, for example, cleaned, before deposition of the α-Ta. A substrate with a top layer of TiN formed thereon, once exposed to the atmosphere, can be at least partially oxidized by oxygen present in the atmosphere. Therefore, at least a portion of the TiN on the surface will form titanium oxynitride ($TiN_xO_y$). Methods disclosed herein can form α-Ta on a surface that includes TiN, titanium oxynitride ($TiN_xO_y$), or a combination thereof. The step of depositing the α-Ta can be undertaken as discussed above. If no further layers or structures are to be formed, the exemplary method is finished after this step.

The method depicted in FIG. 4 next includes an optional step, step 440, deposition of optional layers or formation of structures. Step 440, depositing optional layers or structures can be carried out as known and can be accomplished in order to form various desired articles. The optional structures or layers can be structures or layers that can be, but need not be fabricated using copper. In methods that carry out step 440 to form additional layers or structures including copper, the method can offer the advantage of easily being able to form aluminum processing structures and copper structures on the same substrate with limited extraneous processing steps or inefficiencies.

Figure 3:
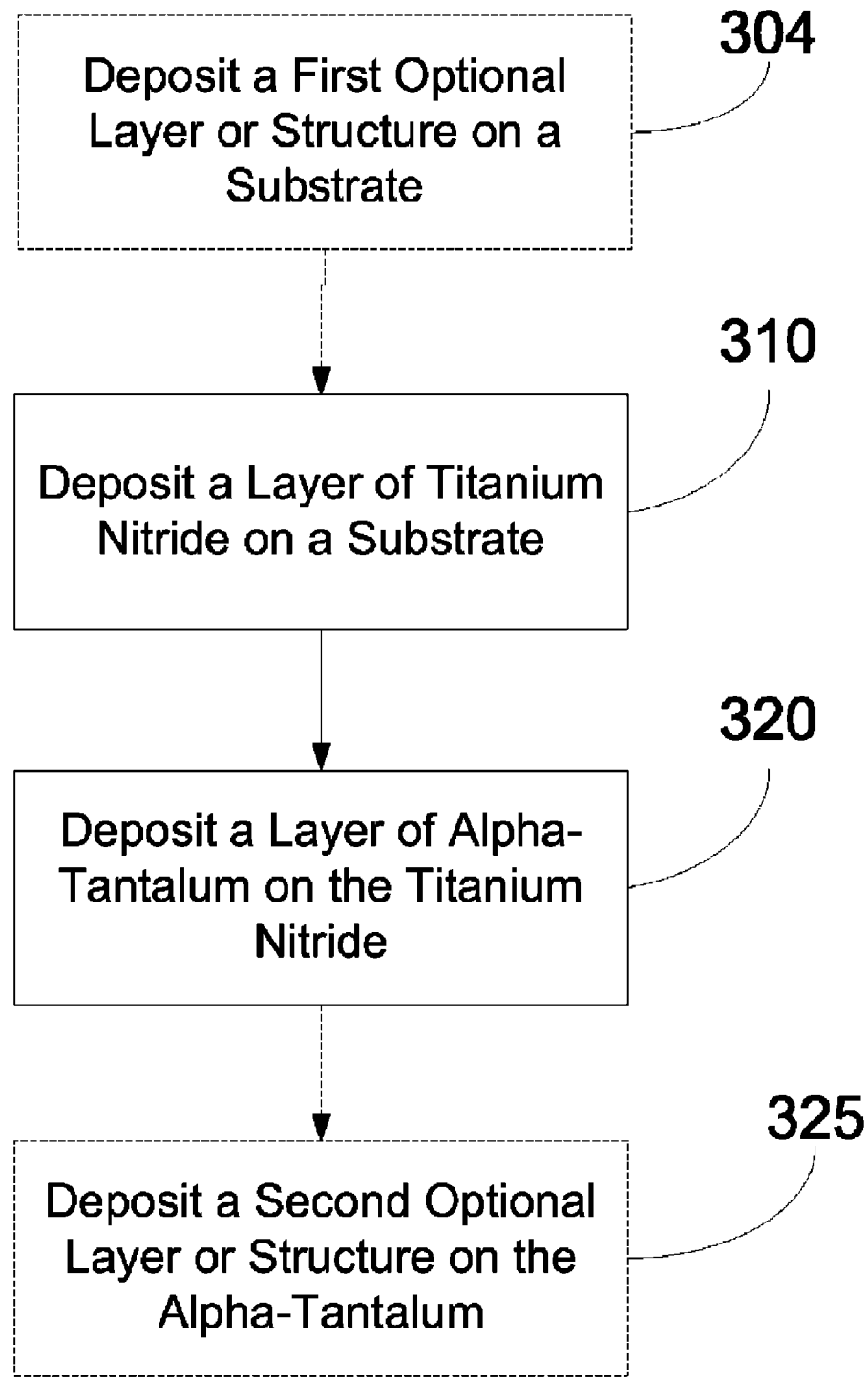
FIG. 3 is a flowchart depicting an exemplary method including optional steps as disclosed herein.
Figure 5:
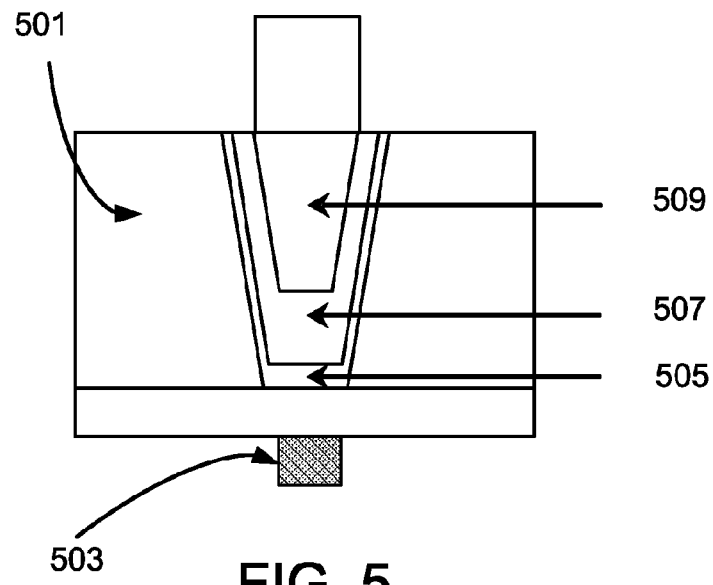
FIG. 5 is a schematic depiction of an exemplary article that can be formed using methods disclosed herein.

An exemplary article that can be made using a variation of the method depicted in FIG. 3 or 4 can be seen in FIG. 5 The article in FIG. 5 is an example of an article that integrates aluminum (Al) (tungsten (W) plug) and copper (Cu) technologies using methods disclosed herein. This specific article includes a substrate 501 that includes or is associated with other structures, including memory element 503. The substrate in this example has a three dimensional structure, for example a plug. The substrate is first coated with a layer of TiN 505, upon which is then deposited a layer of α-Ta 507. Upon the layer of α-Ta is then deposited a layer of Cu 509.

Articles that include layers of α-Ta can be advantageously used in numerous applications. Exemplary applications include, but are not limited to, magnetic disk hard drives, semiconductor interconnect (IC) fabrication, X-ray absorbing layers for X-ray masks, and thermal inkjet printheads for example.

EXAMPLES

A silicon wafer was placed in an ENDURA™ 5500 PVD system (Applied Materials, Inc. Santa Clara, Calif.), and the pressure was decreased to 3 mTorr. A 1000 Å film of TiN (200) was deposited at about 200° C. using self-ionized plasma (SIP) sputter deposition. After deposition of the TiN, the vacuum was broken, and a 300 Å layer of α-Ta was deposited at room temperature using SIP sputter deposition at 3 mTorr.

Figure 6:
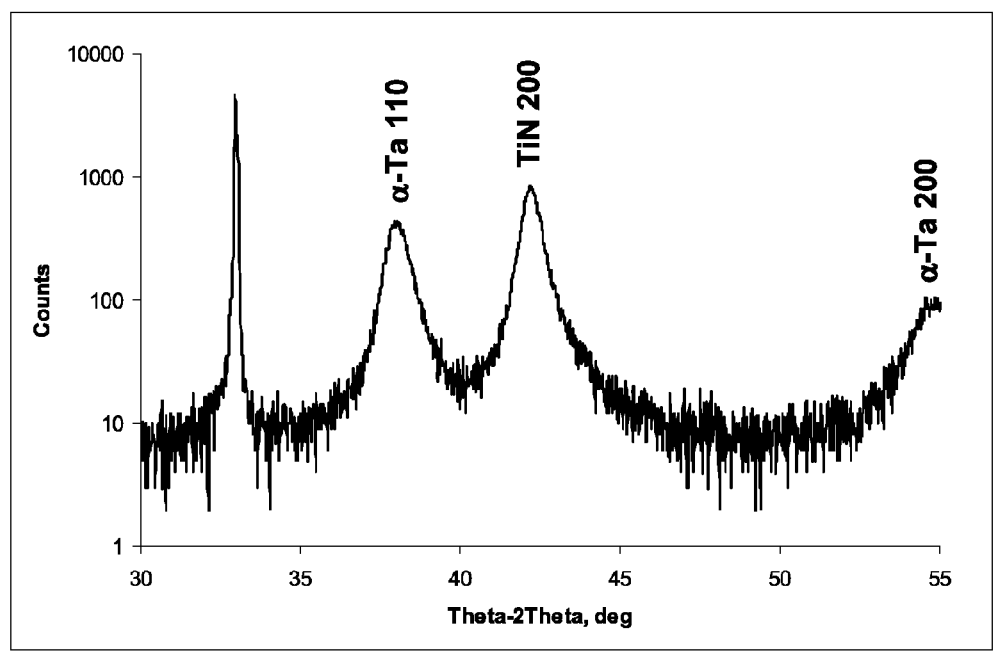
FIG. 6 is a graph of X-ray diffraction data showing titanium nitride (TiN) and α-Ta formed as described herein.

The resistivity of the α-Ta film was measured using a four-probe method combined with SEM imaging and was found to be about 25 to 30 μΩ/cm. A X-ray diffraction (XRD) scan using a X-ray powder diffractometer was taken of the TiN/α-Ta bilayer structure. FIG. 6 shows a plot of count versus diffraction angle of the sample. As seen in FIG. 6, peaks for α-Ta (110), α-Ta (200), and TiN (200) can be distinguished.

Figure 7:
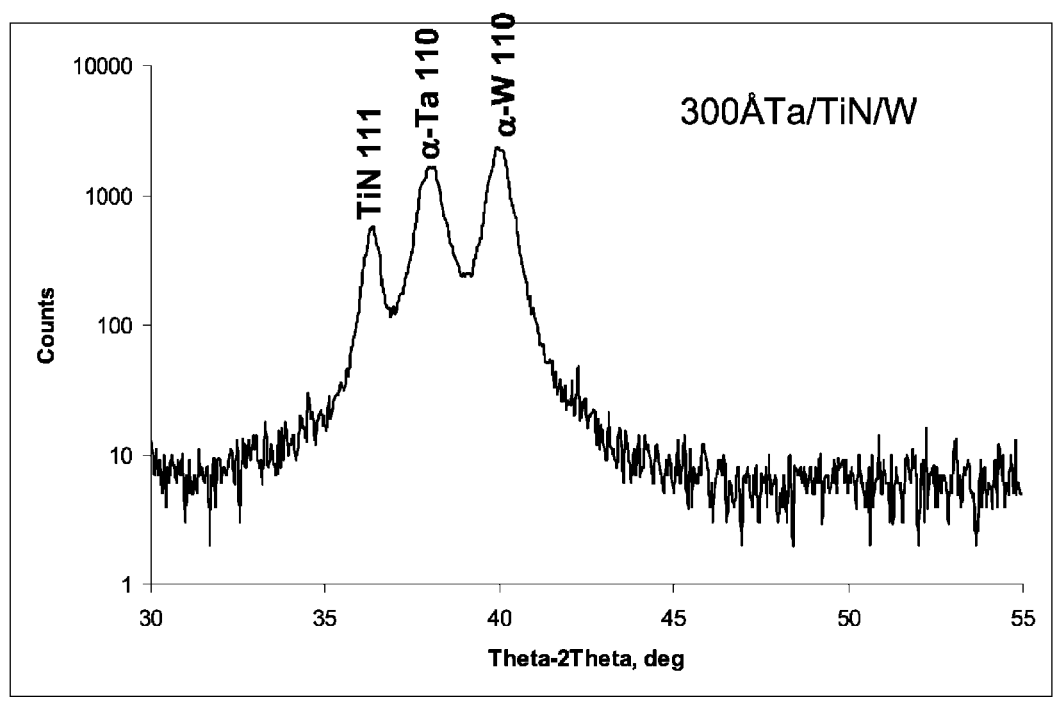
FIG. 7 is a graph of X-ray diffraction data showing tungsten (W), TiN, and α-Ta formed as described herein.

A second bilayer structure was made in the same way except that a 50 Å layer of Ti was deposited, followed by a 250 Å layer of tungsten (W) (110), followed by a 1000 Å layer of TiN (111), and finally a 300 Å layer of α-Ta (110). The resistivity of the α-Ta film was measured using the four-probe method combined with SEM imaging and was found to be about 25 to 30 μΩ/cm. A XRD scan is shown in FIG. 7 and shows a plot of count versus diffraction angle of the sample. As seen in FIG. 7, peaks for α-Ta (110), TiN (111), and W (110) can be distinguished.

Further articles were also formed generally as described above using an ANELVA PVD system (Canon Anvela Corp., Kanagawa, Japan) and it was confirmed that α-Ta was formed. Further articles were also formed using procedures similar to those described above both while maintaining the vacuum and while breaking the vacuum between deposition of the TiN and the α-Ta, and again, it was confirmed that α-Ta was formed.

Thus, embodiments of METHOD OF FORMING LAYERS OF ALPHA-TANTALUM are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A method of forming a multi layer structure comprising the steps of:
    providing a substrate;
    depositing a controlling layer comprising tungsten on the substrate;
    depositing a layer of titanium nitride on the controlling layer; and
    depositing a layer of crystalline alpha-tantalum on the layer of titanium nitride, wherein the alpha-tantalum is deposited at a temperature of less than about 300° C.

2. The method according to claim 1, wherein the tungsten has a (110) crystal plane, the titanium nitride has a (111) crystal plane and the alpha-tantalum has a (110) crystal plane.

3. The method according to claim 1 further comprising depositing a layer of copper on the layer of alpha-tantalum.

4. The method according to claim 3, wherein providing the substrate comprising forming the substrate using aluminum interconnect technology and the method further comprises breaking vacuum between deposition of the titanium nitride and deposition of the alpha-tantalum.

5. The method according to claim 4, wherein the titanium nitride is deposited in a first deposition chamber and the alpha-tantalum is deposited in a second deposition chamber.

6. The method according to claim 1, wherein deposition of the titanium nitride and the alpha-tantalum are independently carried out at temperatures between about room temperature and about 300° C.

7. The method according to claim 1, wherein depositing the layers of titanium nitride and alpha-tantalum are accomplished under a vacuum.

8. The method according to claim 7, wherein the vacuum can be broken between deposition of the layer of titanium nitride and deposition of the layer of alpha-tantalum.

9. The method according to claim 8, wherein the substrate with the layer of titanium nitride deposited thereon can be maintained for extended periods of time before deposition of the layer of alpha-tantalum.

10. The method according to claim 1, wherein the layers of titanium nitride and alpha-tantalum can be deposited using methods chosen from the group consisting of:
    evaporative deposition, electron beam physical vapor deposition, sputter deposition, cathodic arc deposition and pulsed laser deposition.

11. The method according to claim 1, wherein the layers titanium nitride and the alpha-tantalum are deposited using self ionized plasma sputtering.

12. The method according to claim 1, wherein the layer of titanium nitride is from about 100 Angstroms to about 2000 Angstroms thick.

13. The method according to claim 1, wherein the layer of alpha-tantalum is from about 50 Angstroms to about 500 Angstroms thick.

14. A method of forming an article comprising the steps of:
    providing a substrate, the substrate having an aluminum interconnect structure formed thereon or therein;
    placing the substrate in a first chamber under vacuum;
    depositing a layer of tungsten on the substrate;
    depositing a layer of titanium nitride on the layer of tungsten in the first chamber, wherein deposition of the titanium nitride is carried out at a temperature between about room temperature and about 300° C.;
    breaking the vacuum in the first chamber;
    placing the substrate having the layer of titanium nitride formed thereon in a second chamber;
    depositing a layer of alpha-tantalum on the layer of titanium nitride, wherein deposition of the alpha-tantalum is carried out at a temperature between about room temperature and about 300° C.; and
    depositing a layer of copper on the alpha-tantalum layer.

15. The method according to claim 14, wherein the layers of titanium nitride and alpha-tantalum can be deposited using methods chosen from the group consisting of: evaporative deposition, electron beam physical vapor deposition, sputter deposition, cathodic arc deposition and pulsed laser deposition.

16. The method according to claim 14, wherein the layers titanium nitride and the alpha-tantalum are deposited using self ionized plasma sputtering.

17. The method according to claim 14, wherein the layer of titanium nitride is from about 100 Angstroms to about 2000 Angstroms thick.

18. The method according to claim 14, wherein the layer of alpha-tantalum is from about 50 Angstroms to about 500 Angstroms thick.

19. A method of forming a multi layer structure comprising the steps of:
    providing a substrate;
    depositing a controlling layer comprising tungsten on the substrate
    depositing a layer of titanium nitride on the controlling layer; and
    depositing a layer of alpha-tantalum on the layer of titanium nitride, wherein the alpha-tantalum is deposited at a temperature of less than about 300° C.

20. The method according to claim 19, wherein the tungsten has a (110) crystal plane, the titanium nitride has a (111) crystal plane and the alpha-tantalum has a (110) crystal plane.

21. The method according to claim 19, wherein the deposition of the titanium nitride is carried out at a temperature from about room temperature to less than about 300° C.

22. The method according to claim 19, wherein the layers of titanium nitride and alpha-tantalum can be deposited using methods chosen from the group consisting of:
evaporative deposition, electron beam physical vapor deposition, sputter deposition, cathodic arc deposition and pulsed laser deposition.

23. A method of forming an article comprising the steps of:
providing a substrate, the substrate having an aluminum interconnect structure formed thereon or therein;
placing the substrate in a first chamber under vacuum;
depositing a layer of tungsten on the substrate;
depositing a layer of titanium nitride on the layer of tungsten in the first chamber;
breaking the vacuum in the first chamber;
placing the substrate having the layer of titanium nitride formed thereon in a second chamber;
depositing a layer of alpha-tantalum on the layer of titanium nitride; and
depositing a layer of copper on the layer of alpha-tantalum.

* * * * *